United States Patent [19]

Okasaka et al.

[11] Patent Number: 4,931,995
[45] Date of Patent: Jun. 5, 1990

[54] WRITING METHOD IN DRAM

[75] Inventors: Yasuhiko Okasaka; Toshiyuki Ogawa, both of Hyogo, Japan

[73] Assignee: Mitsubishi Denki Kabushiki Kaisha, Tokyo, Japan

[21] Appl. No.: 263,157

[22] Filed: Oct. 27, 1988

[30] Foreign Application Priority Data

Oct. 28, 1987 [JP] Japan ................................. 62-274578

[51] Int. Cl.⁵ ............................................ G11C 13/00
[52] U.S. Cl. ......................... 365/189.05; 365/230.08
[58] Field of Search ............... 365/193, 190, 189, 203, 365/189.05, 230.08

[56] References Cited

U.S. PATENT DOCUMENTS

| | | | |
|---|---|---|---|
| 4,575,825 | 3/1986 | Ozaki et al. | 365/193 |
| 4,596,004 | 6/1986 | Kaufman | 365/193 |
| 4,685,089 | 8/1987 | Patel | 365/193 |
| 4,764,901 | 8/1988 | Sakurai | 365/203 |
| 4,811,299 | 3/1989 | Miyazawa et al. | 365/193 |

OTHER PUBLICATIONS

Minutes of JC-42.3.2 Dram Task Group Meeting held on Jun. 16-17, 1987 in San Diego.

*Primary Examiner*—Terrell W. Fears
*Attorney, Agent, or Firm*—Lowe, Price, LeBlanc, Becker & Shur

[57] ABSTRACT

A data writing method in a DRAM comprises the steps of bringing a row address strobe input signal into an enabling state and successively changing a signal indicative of a row address while the row address strobe input signal is in the enabling state, thereby to write data successively into a plurality of memory cells designated by the row addresses.

8 Claims, 6 Drawing Sheets

WRITING METHOD IN DRAM

BACKGROUND OF THE INVENTION

1. Field of the Invention

The present invention relates to an improvement of a writing method in a DRAM (dynamic random access memory).

2. Description of the Prior Art

FIG. 1 is a block diagram showing an example of a whole construction of a DRAM. This DRAM comprises a memory cell array 1, a column decoder 2, a row decoder 3, a data register 4 and a selector 5. The memory cell array 1 comprises a plurality of memory cells arranged in a matrix including columns and rows, those memory cells being located at respective intersections of a plurality of bit lines connected to the column decoder 2 and a plurality of word lines connected to the row decoder 3.

Referring to a circuit diagram of FIG. 2, one column of memory cells is illustrated. The memory cell array 1 further comprises a sense amplifier 6. Bit lines BL and $\overline{BL}$ are connected to data lines Data and $\overline{Data}$ through FETs (field effect transistors) and inverted data appears on the data line $\overline{Data}$. A sense signal Sn changes between a level Vcc/2 and a ground level, and another sense signal Sp changes between the level Vcc/2 and a level Vcc. Each of the memory cells 7 comprises an FET and a capacitor, the FET having its drain connected to the bit line BL or $\overline{BL}$ and its gate connected to a word line WL. The capacitor has one electrode connected to a cell plate potential Vcp and the other electrode connected to the source of the FET. A pair of bit lines BL and $\overline{BL}$ are set to an equal bit line voltage $V_{BL}$ by means of an equalization signal EQ.

A data transfer control signal DT controls transfer of data between the data register 4 and the bit lines BL and $\overline{BL}$. The data register 4 is connected to serial input/output lines $\overline{SIO}$ and SIO through FETs. Inverted data appears on the serial input/output line $\overline{SIO}$.

Referring to a circuit diagram of FIG. 3, an example of the column decoder 2 is illustrated. A desired pair of bit lines BL and $\overline{BL}$ is selected by a column selection signal YSelect corresponding to a column address CAi. A reference character $\overline{FW}$ represents a data control signal at the time of flash write.

Referring to FIG. 4, an example of the row decoder 3 is illustrated. The selector 5 in FIG. 1 comprises a circuit similar to that of the column decoder shown in FIG. 3.

A conventional data writing method in the DRAM thus constructed will be described in the following.

FIG. 5A is a timing chart showing a conventional data writing method in the case of data transfer. In transferring data, an address Ads is read at a fall of a row address strobe input signal $\overline{RAS}$.

When the row address strobe input signal $\overline{RAS}$ falls, the data transfer control signal DT rises and data of the data register 4 appears on the bit line BL. Then, the potential of the word line WL rises and memory cells of the i row are activated. A signal S for activating the sense amplifier 6 rises and the sense amplifier 6 is operated to determine a high level or a low level of the data appearing on the bit line BL. When the row address strobe input signal $\overline{RAS}$ rises, the data transfer control signal DT falls and the potential of the word line WL also falls. Thus, the high or low data of the data register 4 appearing on the bit line BL is written into the memory cells 7 of the i row. When the potential of the word line WL falls, the equalization signal EQ rises to cause the potentials of the bit lines BL and $\overline{BL}$ to be Vcc/2.

The same procedures as described above are executed to write the same data as that of the i row into the j row.

FIG. 5B is a timing chart showing a conventional data writing method in the case of flash write.

In the case of flash write, an address Ads is read at a fall of the row address strobe input signal $\overline{RAS}$. When the row address strobe input signal $\overline{RAS}$ falls, the data control signal $\overline{FW}$ becomes low, causing the signals YSelect for selecting the bit lines to be all high. As a result, data of the data line Data appears on all the bit lines BL. Assuming that the data is high, the high data appears on all the bit lines BL. After that, the potential of the word line WL of the i row of the address Ads rises to activate the memory cells 7 of the i row. The signal S for activating the sense amplifier 6 rises to determine the high data on the bit lines BL. When the row address strobe input signal $\overline{RAS}$ rises, the data control signal $\overline{FW}$ becomes high in response thereto and the signal YSelect for selecting the bit lines becomes low. When the word line WL of the i row becomes low, the equalization signal EQ rises to cause the potentials of the bit lines BL and $\overline{BL}$ to be Vcc/2.

Thus, the high data is written in the memory cells 7 of the i row. The same data as that of the i row can be written into the j row by executing the same procedures as described above. When data is low, it can be written in a similar manner as in the case of the high data.

It is indicated in FIGS. 5A and 5B that a power supply current Icc of about 100 mA flows at each rise of the signal S for activating the sense amplifier 6.

According to the conventional writing methods, the sense amplifier 6 is activated each time the address Ads is changed, and the large power supply current Icc flows each time. In addition, since one cycle period is almost equal to a normal read/write cycle, it takes much time to write data into a large number of addresses.

SUMMARY OF THE INVENTION

In view of the above described prior art, an object of the present invention is to provide a method of writing data at high speed with low power consumption in a DRAM.

According to the present invention, a data writing method in a DRAM comprises the steps of bringing a row address strobe input signal into an enabling state and continuously changing a signal indicative of a row address while the row address strobe input signal is in the enabling state, whereby data are successively written into a plurality of memory cells designated by the row addresses.

In the above described writing method, the row address can be successively changed while the data to be written are held on bit lines and accordingly the data can be written at high speed. In addition, a sense amplifier is activated only once in the sequential data writing operation and thus the writing can be carried out with low consumption of power.

DESCRIPTION OF THE PREFERRED EMBODIMENTS

Figure 1:
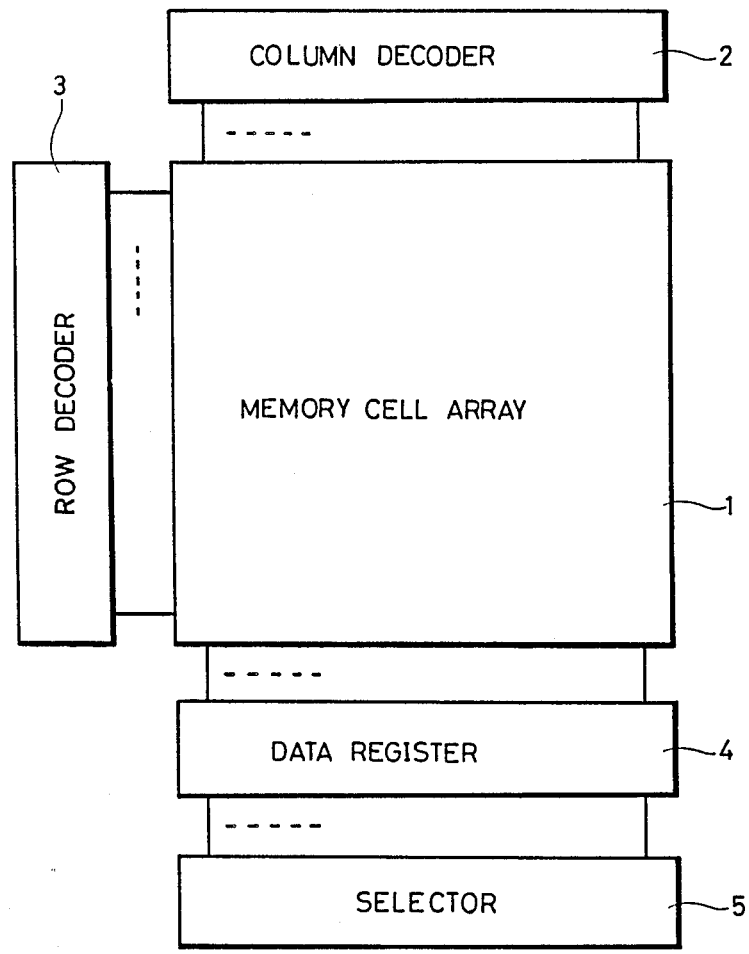
FIG. 1 is a block diagram showing a whole construction of a DRAM.
Figure 2:
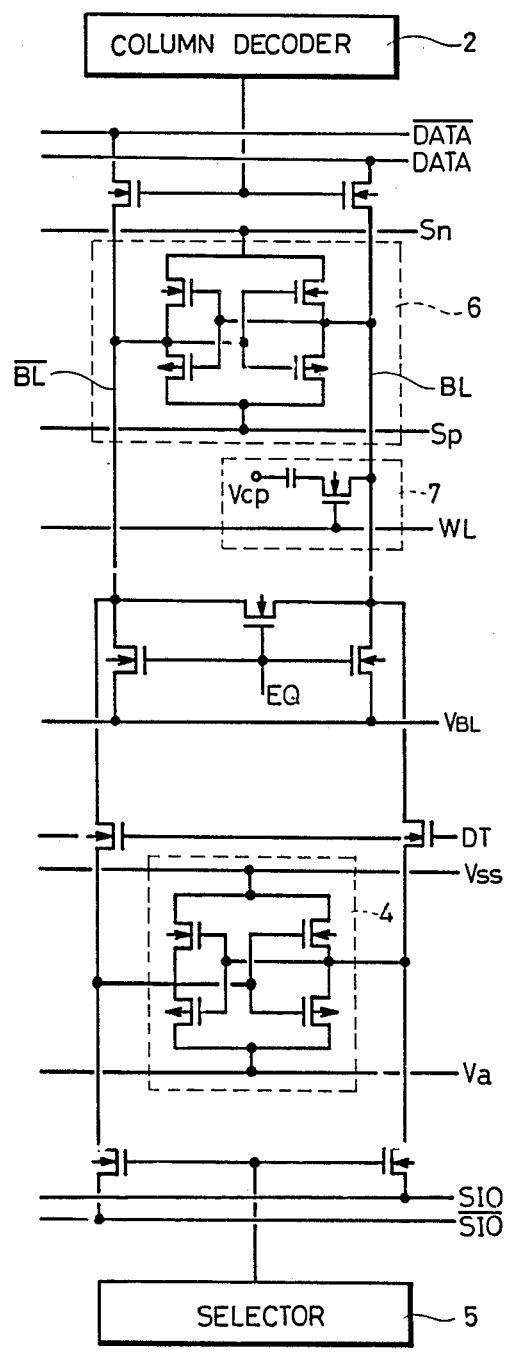
FIG. 2 is a circuit diagram illustrating a memory cell column and a data register.
Figure 3:
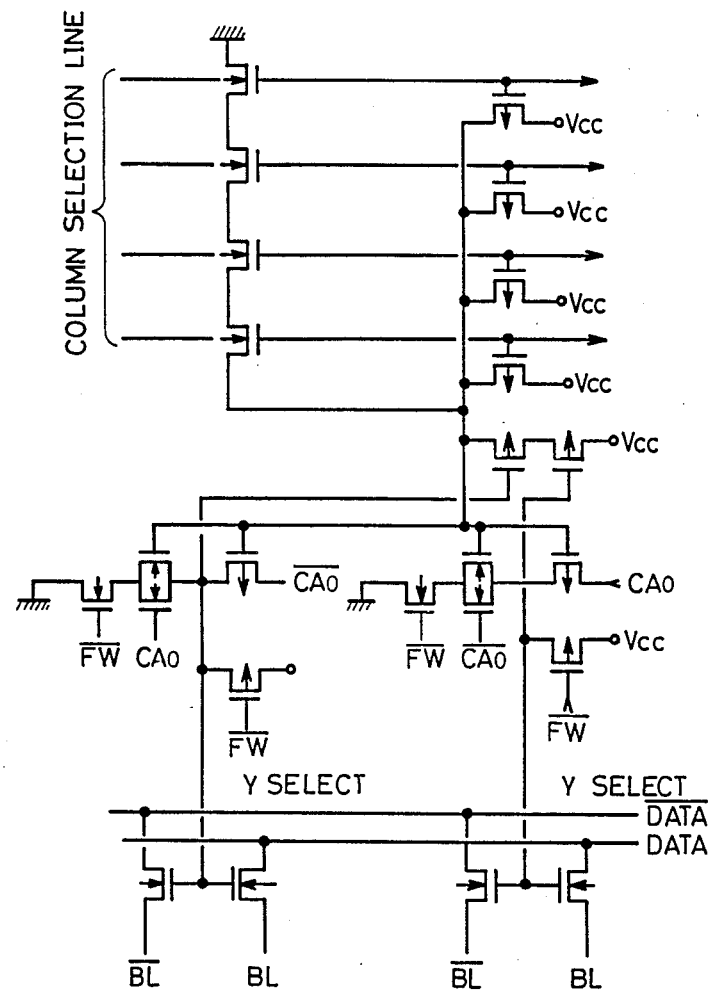
FIG. 3 is a circuit diagram illustrating a column decoder.
Figure 4:
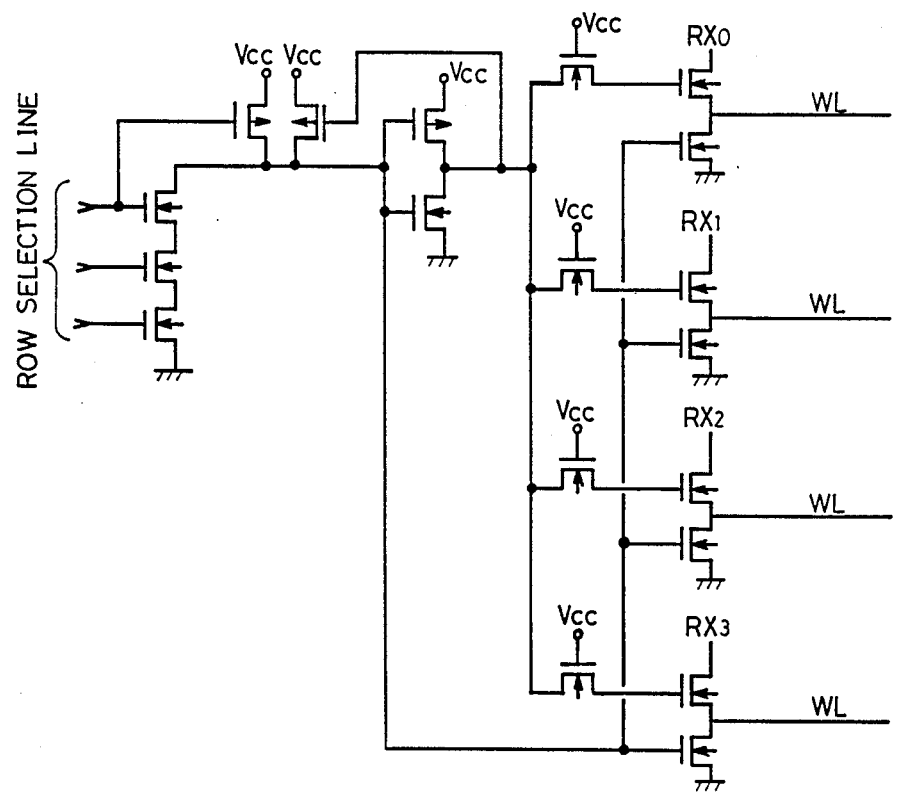
FIG. 4 is a circuit diagram illustrating a row decoder.
Figure 5A:
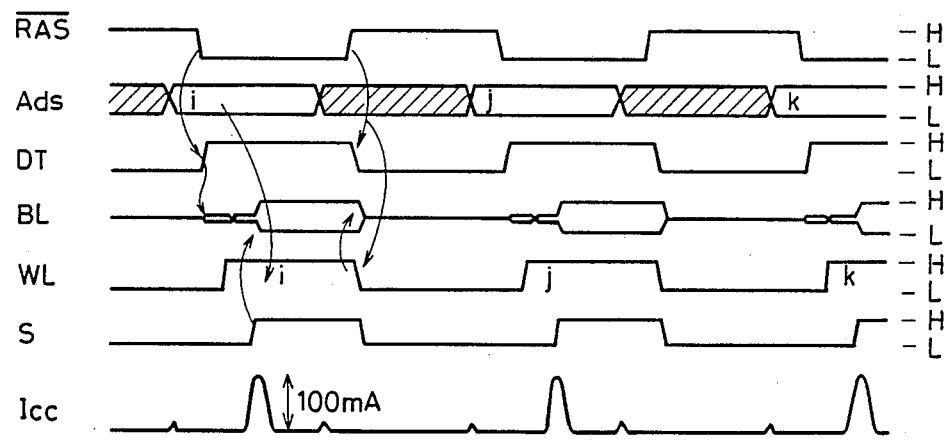
FIGS. 5a and 5b represents timing charts showing conventional writing methods in a DRAM.
Figure 5B:
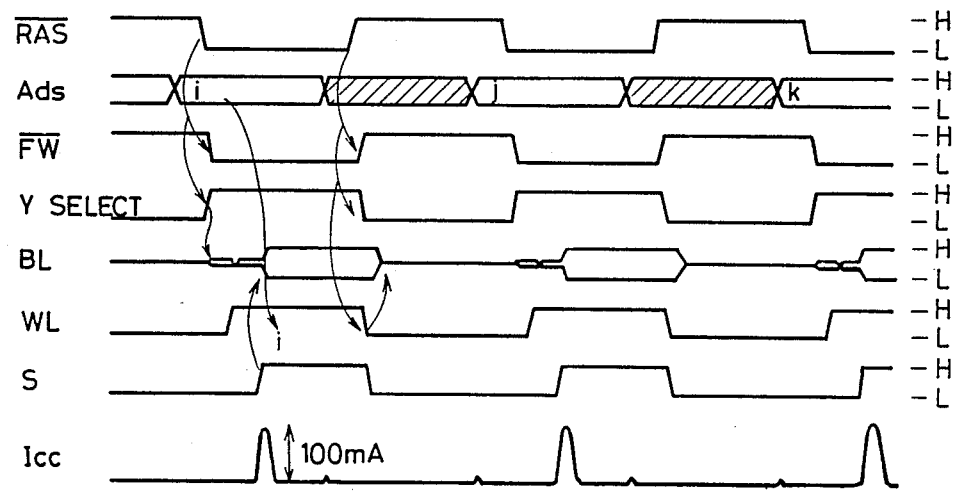
Figure 6A:
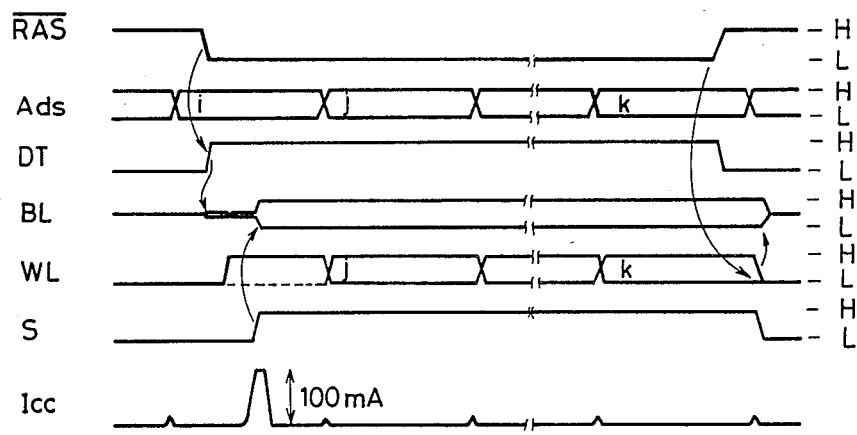
FIGS. 6a and 6b represents timing charts showing writing methods in a DRAM according to embodiments of the present invention.

Referring to FIG. 6A, there is illustrated a timing chart of a data writing method according to an embodiment of the present invention in the case of data transfer. In transferring data, the same operation as in the prior art is effected until the row address strobe input signal $\overline{RAS}$ falls and the word line WL of the i row of the address Ads rises. When the address Ads changes from the i row to the j row with the row address strobe input signal RAS being low, the word line WL of the i row becomes low and the word line WL of the j row becomes high in response thereto. Thus, the memory cells 7 of the j row are activated upon completion of writing into the memory cells 7 of the i row. The data written in the i row are still held on the bit lines BL and when the address Ads changes from the j row to the k row, the word line of the j row becomes low and the word line WL of the k row becomes high. Thus, upon completion of writing of the same data as that of the i row into the memory cells of the j row, the memory cells 7 of the k row are activated. Those operations are repeated, whereby the data can be written successively into rows selected at random. After the rise of the row address strobe input signal $\overline{RAS}$, the same operation as in the prior art is effected.

Figure 6B:
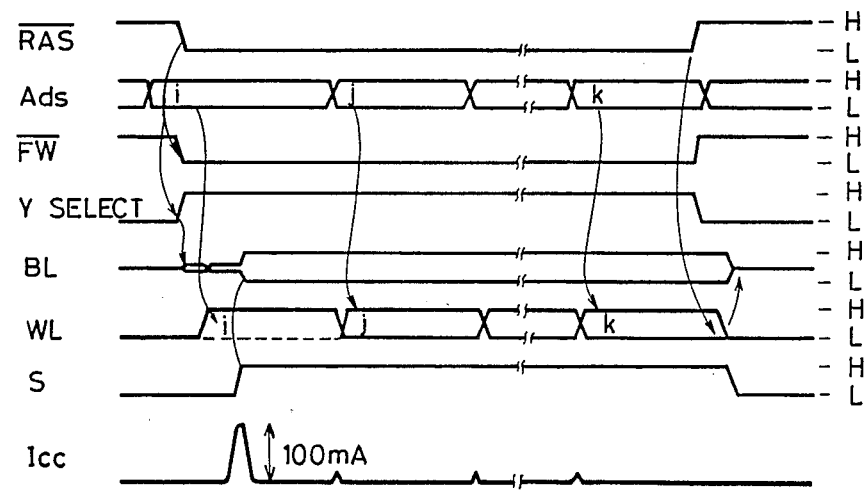

Referring to FIG. 6B, there is illustrated a timing chart of a data writing method according to another embodiment of the present invention in the case of flash write.

In the case of flash write, the conventional flash write operation is performed in the same manner until the row address strobe input signal $\overline{RAS}$ falls and the potential of the word line WL of the i row of the address signal Ads rises. It is now assumed that high data appears on the data line Data. When the address Ads changes from the i row to the j row with the row address strobe input signal $\overline{RAS}$ being low, the word line WL of the i row becomes low and the word line WL of the j row becomes high in response thereto. Thus, upon completion of writing of the high data into all the memory cells 7 of the i row, the memory cells 7 of the j row are all activated.

The high data written in the i row are still held on the bit lines BL and when the address Ads changes from the j row to the k row, the word line WL of the j row becomes low and the word line WL of the k row becomes high in response thereto. Thus, upon completion of writing of the high data into all the memory cells 7 of the j row, the memory cells 7 of the k row are activated. Those operations are repeated, whereby the data can be written successively into rows selected at random. In this case, the written data are all the same. After the rise of the row address strobe input signal $\overline{RAS}$, the same operation as in the prior art is effected. When data are low, the low data can be written in a similar manner as in the case of the high data. A power supply current Icc of about 100 mA flows at a rise of the signal S for activating the sense amplifier 6. However, it can be seen from FIGS. 6A and 6B that the large current flows only once while the high-speed writing operation is being done.

In the above described writing methods, the row address can be successively changed while the data to be written are held on the bit lines, and accordingly the data can be written at high speed. In addition, since the sense amplifier is activated only once during the sequential data writing operation, the writing operation can be carried out with low consumption of power.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data writing method in a DRAM, comprising the steps of:

bringing a row address strobe input signal into an enabling state, and successively changing a signal indicative of a row address a plurality of times while said row address strobe input signal is in the enabling state, thereby to write data successively into a plurality of memory cells designated by said row addresses.

2. In a method for writing data in a DRAM, including the steps of bringing a row address strobe input signal to an enabling state, changing a row address signal indicative of an address of a row for writing the data, enabling one of a plurality of word lines in accordance with the row address for writing the data, and activating a sense amplifier, the improvement comprising the steps of:

changing said row address signal a plurality of times during a single enabled state of the row address strobe signal, and maintaining data on bit lines throughout the enabled state of the row address strobe, thereby writing said data into a plurality of rows each having a different row address during a single enabled state of the row address input signal and increasing operational speed of the DRAM.

3. The improved method of claim 2, comprising the further step of activating a sense amplifier for a period of time substantially equal to the time during which the row address strobe input signal is enabled, thereby reducing power supply current requirements for operating the DRAM.

4. In a method for writing data in a DRAM, including the steps of bringing a row address strobe input signal to an enabling state, changing a row address signal indicative of an address of a row for writing the data, enabling a word line in accordance with the row address for writing the data, and activating a sense amplifier, the improvement comprising the steps of:

changing said row address signal a plurality of times during a single enabled state of the row address strobe signal, and thereby writing data into a plurality of rows each having a different row address during a single enabled state of the row address input signal and increasing operational speed of the DRAM.

5. The improved method of claim 4, comprising the further step of activating a sense amplifier for a period of time substantially equal to the time during which the row address strobe input signal is enabled, thereby reducing power supply current requirements for operating the DRAM.

6. In a method for writing data in a DRAM, including the steps of bringing a row address strobe input signal to an enabling state, changing a row address signal indicative of an address of a row for writing the data, enabling one of a plurality of word lines in accordance with the row address for writing the data, and activating a sense amplifier, the improvement comprising
   increasing a writing speed in the DRAM by performing the steps of:
   precharging said bit lines only once,
   causing said sense amplifiers to maintain data applied to said bit lines, and
   while said sense amplifiers maintain said data on said bit lines, changing signals applied to said word lines,
   thereby increasing said writing speed.

7. In a method for writing data in a DRAM, including the steps of bringing a row address strobe input signal to an enabling state, changing a row address signal indicative of an address of a row for writing the data, enabling one of a plurality of word lines in accordance with the row address for writing the data, and activating a sense amplifier, the improvement comprising the steps of:
   changing said address of a row for writing the data represented by said row address signal a plurality of times during a single enabled state of the row address strobe signal, and
   maintaining data on bit lines throughout the enabled state of the row address strobe,
   said step of maintaining said data on said bit lines including the steps of precharging said bit lines only once and changing signals applied to said word lines while said sense amplifier maintains said data on said bit lines,
   thereby writing said data into a plurality of rows each having a different row address during a single enabled state of the row address input signal and increasing operational speed of the DRAM.

8. In a method for writing data in a DRAM, including steps of bringing a row address strobe input signal to an enabling state, changing a row address signal indicative of an address of a row for writing the data, enabling one of a plurality of word lines in accordance with the row address for writing the data, and activating a sense amplifier, the improvement comprising
   increasing a writing speed in the DRAM by performing the steps of:
   precharging said bit lines only once,
   causing said sense amplifiers to maintain data applied to said bit lines, and
   while said sense amplifiers maintain said data on said bit lines, changing enabling signals applied to said word lines a plurality of times,
   thereby increasing said writing speed.

* * * * *